United States Patent [19]

Mikeman

[11] 4,145,142
[45] Mar. 20, 1979

[54] APPARATUS FOR AND METHOD OF TESTING DIRECT-VIEW IMAGE INTENSIFIERS

[75] Inventor: Carl H. Mikeman, Fairfax City, Va.

[73] Assignee: The United States of America as represented by the Secretary of the Army, Washington, D.C.

[21] Appl. No.: 855,531

[22] Filed: Nov. 28, 1977

[51] Int. Cl.² .................... G01J 1/10; H01J 39/12; G01D 18/00; G01R 31/24
[52] U.S. Cl. ........................... 356/229; 250/213 VT; 250/252; 324/20 R
[58] Field of Search ............... 356/165, 166, 168, 222, 356/229, 230; 250/207, 213 VT, 252; 324/20 R

[56] References Cited

U.S. PATENT DOCUMENTS 2,376,166  5/1945  Miller .................................. 356/230

OTHER PUBLICATIONS

N. B. Evershed, G. S. Richards, "A Field Test Set for Night Vision Devices," Optical Engineering, vol. 15, No. 3, pp. 251-254, May-Jun. 1976.
H. K. Pollehn, "Image Evaluation of Image Intensifiers" Conference: Image Assessment & Specification, Rochester, N.Y. USA pp. 271-276.
S. Weiser "Testing Image Quality in Electro-Optical Devices" Conference: Image Assessment & Specification, Rochester, N.Y. USA pp. 264-270.

Primary Examiner—John K. Corbin
Assistant Examiner—Rolf Hille
Attorney, Agent, or Firm—Nathan Edelberg; Milton W. Lee; Aubrey J. Dunn

[57] ABSTRACT

A beam from a test image is split into two paths. The beam in one path may pass through broad-band or narrow-band attenuators to the intensifier being tested. A portion of the beam in the other path passes through a hole in a reflector to the eye of a viewer. The intensifier provides an output beam, and this beam is reflected by the reflector to the eye of the view. The viewer thus sees an image that may have a lighter or darker portion, depending on whether the output beam from the intensifier is brighter or dimmer than the test image. Various attenuators may be inserted in the one optical path to provide tests of such things as intensifier gain, relative gain, or EBI on a go/no go basis.

4 Claims, 1 Drawing Figure

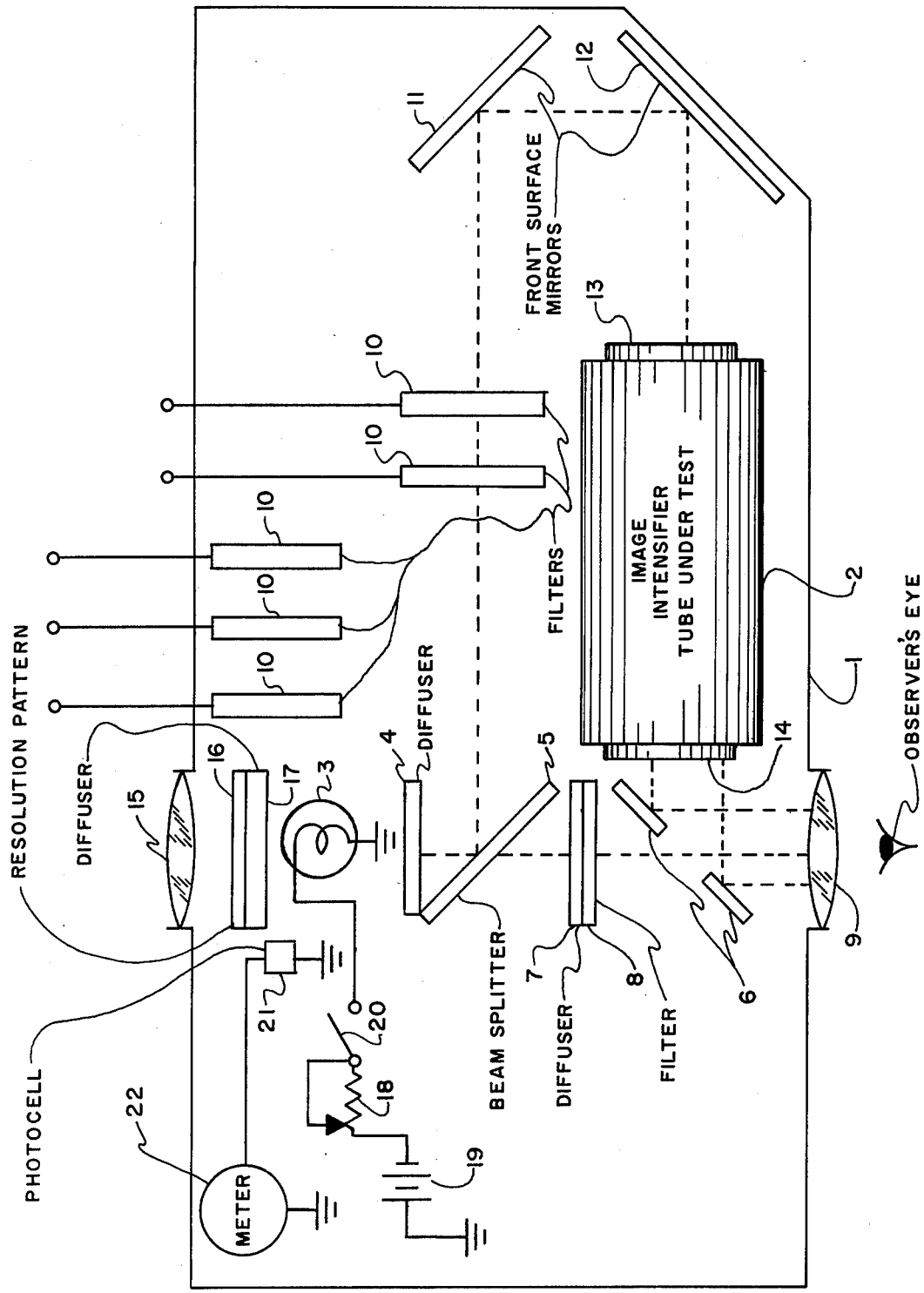

APPARATUS FOR AND METHOD OF TESTING DIRECT-VIEW IMAGE INTENSIFIERS

The invention described herein may be manufactured, used, and licensed by the U.S. Government for governmental purposes without the payment of any royalties thereon.

BACKGROUND OF THE INVENTION

The instant invention is in the field of night vision devices. One element used in many such devices is the direct-view image intensifier. Until now, field checking or testing of an intensifier has not been practical, since the various checking or testing devices require elaborate equipment set-ups and skilled operators. The instant invention provides a cheap and simple go/no go way of checking or testing an intensifier and can readily be operated with a minimum of skill or training of an operator.

BRIEF SUMMARY OF THE INVENTION

The invention is an apparatus for and method of testing direct-view image intensifiers or the like. The apparatus includes a means for providing a test image, and a beam splitter for splitting a beam from the image into separate optical paths. One optical path may include various attenuators and the input surface of the intensifier. The other optical path includes a mirror with a hole therein. The mirror is positioned to reflect the image on the output surface of the intensifier toward an operator. The operator thus sees a composite image, one part being the portion of the test image visible through the hole in the mirror, and the remainder being the portion of the intensifier output image reflected by the mirror. Unless the two parts of the composite image have equal brightness, the operator will see either an image with a darker or lighter portion of the hole size.

BRIEF DESCRIPTION OF THE DRAWING

The single drawing FIGURE is a schematic showing of the apparatus of the invention.

DETAILED DESCRIPTION OF THE INVENTION

The invention may perhaps be best understood by referring to the drawing, in which numeral 1 designates a housing containing an intensifier tube 2 under test. This tube may be tested for such things as gain, relative gain at various wavelengths, and EBI by interposing various filters in the optical path between a test image and the tube. The test image for the system may be provided in various ways, such as by light 3 adjacent diffuser 4. The beam from diffuser 4 is split into two paths by beam splitter 5. One of the paths passes to the back of perforated mirror 6, through optical diffuser 7 and colon matching filter 8. A portion of the light in the path thus passes through the hole in mirror 6 and is focussed by eyepiece 9 for an observer's eye.

The other path from splitter 5 passes through selected filters 10 to front surface mirrors 11 and 12 and to the input surface 13 of tube 2. An intensified image of the light on surface 13 appears, if the tube is properly operating, on output surface 14 of the tube. This image is reflected by mirror 6 through eyepiece 9 to the observers eye. The observer thus sees a composite image in the eyepiece.

A test image may also be provided by means other than bulb 3. For example, an objective lens 15 may focus an external scene on beam splitter 5. If desired, a resolution pattern 16 and/or diffuser 17 may be interposed between 15 and 5. In order to check gain of various tubes under test light 3 may be adjusted in intessity. This is accomplished by variable resistor 18 in circuit between battery 19 and light 3. Switch 20 controls on-off of 3. The tube under test would also be powered from battery 19 (by connections not shown). Photocell 21 senses the light from light 3 and gives an indication on meter 22. When he wants to check tube gain, the operator adjusts variable resistor 18 for the correct reading on meter 22 in accordance with the particular tube type being tested. Alternatively, ones of filters 10 may be neutral density filters and may be inserted in the optical path toward mirror 11. If the tube is operating properly, the operator will see an image in eyepiece 9 of uniform brightness, or if a test pattern is used, will see an output image corresponding to the test image. For testing EBI of a tube, one of filters 10 may be opaque and switch 20 would be open. In order to test for relative gain at desired wavelengths, optical bandpass filters may be used. Typical of such filters are those centered on 0.8 and 0.85 micrometers.

Although a specific embodiment has been shown and described, other embodiments may be obvious to ones skilled in the art, in view of and within the scope of the invention as herein described. For example, mirrors 11 and 12 may be replaced by a corner reflector or other equivalent.

I claim:

1. A system for testing a direct-view image intensifier device having an input surface for receiving an input beam and an output surface for providing an output beam, the system including:
    means for providing a test beam;
    means for splitting said beam into two optical paths;
    attenuator means;
    wherein one of said paths includes said attenuator means between said splitter and said input surface of said device;
    beam combining means;
    wherein the other optical path includes said combining means; and
    whereby said combining means combines the output beam of said device with the test beam of the other optical path.

2. The system of claim 1 wherein said combining means obscures a portion of said other optical path and passes a portion of said output beam.

3. The system of claim 2 wherein said combining means has a reflective region surrounding a transparent region and whereby the unobscured portion of said other optical is visible through said transparent region and further whereby the unpassed portion of said output beam is reflected by said reflective region.

4. A method of testing a direct-view image intensifier device having an input surface for receiving an input beam and an output surface for providing an output beam, the method including the steps of:
    generating a test beam;
    splitting said test beam into two optical paths;
    attenuating the beam in one of said paths and directing the attenuated beam onto said input surface; and
    combining the beam in the other optical path with said output beam.

* * * * *